United States Patent [19]

Fujishima

[11] Patent Number: 5,276,339
[45] Date of Patent: Jan. 4, 1994

[54] SEMICONDUCTOR WITH A CONDUCTIVITY MODULATING-TYPE MISFET

[75] Inventor: Naoto Fujishima, Kanagawa, Japan

[73] Assignee: Fuji Electric Co., Ltd., Kawasaki, Japan

[21] Appl. No.: 822,941

[22] Filed: Jan. 21, 1992

[30] Foreign Application Priority Data

Mar. 29, 1991 [JP] Japan .................................. 3-66897

[51] Int. Cl.$^5$ ............................................. H01L 27/02
[52] U.S. Cl. .................................... 257/127; 257/212; 257/378; 257/488
[58] Field of Search ............... 257/487, 488, 489, 490, 257/494, 495, 127, 378, 401, 212, 124, 125, 546, 587, 409, 630

[56] References Cited

U.S. PATENT DOCUMENTS

| | | |
|---|---|---|
| 4,377,816 | 3/1983 | Sittig .................................... 257/495 |
| 4,654,691 | 3/1987 | Shirasawa et al. .................... 257/488 |

OTHER PUBLICATIONS

High Voltage DMOS and IGBT for FPD Driver IC, Proc. of the 1990 Int'l. Symposium on Power Semiconductor Devices & ICs, Tokyo, pp. 60-65.

*Primary Examiner*—Sara W. Crane
*Attorney, Agent, or Firm*—Kanesaka and Takeuchi

[57] ABSTRACT

In a semiconductor equipped with a conductivity modulating MISFET (IGBT) with a high withstand voltage in blocking forward and reverse directions, a withstand power is maintained in lieu of a drain wall disposed to improve the withstand power, and a current-carrying capacity, which is restricted by the drain wall, is increased. A potential at the drain wall disposed between a DMOS section and a collector section is transmitted at a portion between the collector section and an isolation layer by an channel stop electrode (201) that maintains the withstand power, while an increase in the current-carrying capacity is achieved by forming a conductivity modulating layer alone between the above section.

10 Claims, 6 Drawing Sheets

SEMICONDUCTOR WITH A CONDUCTIVITY MODULATING-TYPE MISFET

BACKGROUND OF THE INVENTION AND RELATED ART STATEMENT

The present invention relates to a semiconductor equipped with a conductivity modulating-type MISFET (IGBT) used as an output element for a line driver for serial data transfer, or used as a switching element to drive a multiple power source. More specifically, the present invention relates to a semiconductor equipped with an IGBT in which voltages between a source and a collector are high in terms of blocking voltage in both the forward and reverse directions.

A conventional semiconductor equipped with a conductivity modulating-type MISFET (IGBT) with a high withstand voltage in blocking in both the forward and reverse directions may be exemplified as shown in FIG. 9, in which an n⁻-type conductivity modulating layer (103) is formed on a p-type substrate (101) by means of epitaxial growth. In this semiconductor, an n-type embedded layer 102 is formed on the p-type substrate, on which the n⁻-type conductivity modulating layer (103) is formed by means of epitaxial growth. A region forming the IGBT is separated from its surroundings with an island-like shape by a p-type isolation (104). On the surface of the conductivity modulation layer (103) in this region, p-type base layers (106) and n⁺-type source layers (107) are formed by double diffusion. A gate oxide film (108) is laminated on these surfaces, over which a gate electrode (109) is disposed to form an MIS section (DMOS) driven by the electrode (109).

First, a p-type deep collector layer (110) and a p⁺-type collector layer (111) are formed on the surface of the conductivity modulating layer (103) at a location opposite to the DMOS section.

Then, an n⁺-type drain wall (105) is formed so as to enclose these collector layers. The drain wall (105) extends from a surface of the conductivity modulating layer (103) to an embedded layer (102). The collector layers (110 and 111) are coupled to a DMOS section (120) or the isolation (104), via the drain wall (105) by means of the conductivity modulating layer (103).

The base layers (106) of the DMOS section (120) and the source layers (107) are connected to a source electrode (121) and the isolation (104) is connected to a source electrode (122), each electrode being applied with a source potential S. The collector layer (111) is provided with a collector electrode (131), to which a collector potential C is applied.

Functions of such an IGBT will be explained by referring to an equivalent circuit as shown in FIG. 11.

First, when a potential G which is a positive bias relative to a source potential S, is applied to the gate electrode 109 the surface of the p-type base layer (106) beneath the gate electrode (109) is inverted, whereby a MOSFET (604) formed in the DMOS section (120) turns on and a potential at the conductivity modulating layer (103) becomes nearly equal to the source potential S. Since the collector potential C is higher than the source potential S and is in forward direction potential, holes are supplied from the collector layers (111 and 110) to which the collector potential C is applied. This turns on a PNP transistor (606) formed of a collector layer (110), a conductivity modulating layer (103) and a base layer (106) and a PNP transistor (606) formed of the collector layer (110), the conductivity modulating layer (103) and the isolation layer (104). As a result, a current flows from the collector electrode (131) to the source electrode (121 or 122) through three paths passing the MOSFET (604), the PNP transistor (603), and the PNP transistor (606).

The IGBT is blocked in the forward direction when the collector potential C is biased positively relative to the source potential S and the gate potential G and is applied to the collector electrode 131, and the source potential S and the gate potential G are the same potential. In this state, a depletion layer (141) extends from a p-n junction of the p-type base layer (106) and the n⁻-type conductivity modulating layer (103), and a depletion layer (140) extends from a p-n junction of the p-type isolation layer (104) and the n⁻-type conductivity modulating layer (103).

On the other hand, the IGBT is blocked in the reverse direction when the collector potential is biased negatively relative to the source potential and the gate potential and is applied to the collector electrode 131. In this state, a depletion layer (150) extends from a p-n junction of the p-type collector layer and the n⁻-type conductivity modulating layer (103).

As described above, a semiconductor equipped with the IGBT shown in FIG. 9 is a device embodying a bidirectional blocking in both the forward and reverse directions.

To construct such an IGBT capable of the bidirectional blocking described above, it is necessary to study prevention of latching up in parasitic thyristors, prevention of punch-through in a blocked condition, prevention of channels due to inversion of the surface of a conductivity modulating layer, and prevention of an avalanche effect at the edges of the collector layers.

In the IGBT shown in FIGS. 9 and 11, if a current amplification $h_{FE}$ in the PNP transistor (603) is too high, a current flows into a resistance component (601) of the p-type base layer (106), whereby an NPN transistor (602) formed of the n⁺-type source (107), the p-type base layer (106) and the n⁻-type conductivity modulating layer (103) turns on. This causes the IGBT to be in a latch-up state, making gate control impossible. To prevent such an occurrence, the current amplification $h_{FE}$ of the PNP transistor (603) is controlled by the n-type drain wall (105).

Between the p-type base layer (106) and the collector layer (110) and between the p-type isolation layer (104) and the collector layer (110), the n-type deep drain wall (105) is so disposed that it surrounds the collector layer (110). Therefore, the depletion layers (140), (141) and (150) extending over the n⁻-type conductivity modulating layer (103) are restricted in spread by the drain wall (105), thus preventing a punch-through that could be attributed to these depletion layers.

The surface of the n⁻-type conductivity modulating layer (103) tends to form channels as a result of an inversion due to a very small potential difference. These channels cause short circuits across the p-type base layer (106) and the collector layer (110) as well as across the p-type isolation (104) and the collector layer (110), thus reducing the voltage withstand capability of the IGBT. Formation of the above channels is prevented by disposing the n⁺-type drain wall (105) between the isolation layer (104) and the collector layer (110).

In a reverse direction blocking state where the collector potential C is negatively biased, edges of the collector layer (111) become a high electric field, which leads to an occurrence of avalanche effect, resulting in reduction in the voltage withstand capability of the IGBT. To prevent such a high electric field, the p-type deep or thick collector layer (110) is formed and its edges are formed with a larger curvature.

However, in such an IGBT as that described above, the current amplification $h_{FE}$ cannot be increased because the n+-type drain wall is disposed. Therefore, it is difficult to increase the current carrying capacity of the IGBT. On the other hand if no n-type drain wall is disposed, generation of the latch-up, punch-through and surface channels cannot be prevented, thereby greatly reducing the voltage withstand capability.

To prevent the avalanche effect in the reverse direction blocking state, a deep or thick p-type collector layer is formed. For this reason, the junction of the p-type collector layer and the n⁻-type conductivity modulating layer is inclined, and a gradient of the impurity concentration varies continuously.

Therefore, the efficiency of supplying holes from the p-type collector layer to the n⁻-type conductivity modulating layer is low, which makes it difficult to improve the conductivity in the conductivity modulating layer. It is also difficult to increase the current-carrying capacity of the IGBT.

Accordingly, an object of the present invention is to obviate the above problems and to provide an IGBT with a large current-carrying capacity while maintaining a voltage withstand capability in a blocking condition by applying to an IGBT preventive means that performs the same functions as a drain wall or a deep collector layer in a blocking condition where a voltage withstand capability is required, and that improves the conducting capability of a conductivity modulating layer in an energized condition.

SUMMARY OF THE INVENTION

To solve the above problems, a semiconductor of the present invention equipped with a conductivity modulating-type MISFET with a high withstand voltage in bidirectional blocking is provided with a conductivity modulating layer formed of a second conductivity type separated in an island-like shape by an isolated section formed of a first conductivity type; and an MIS section with a base region layer formed of the first conductivity type which is provided on the surface of the above conductivity modulating layer, and with a source region layer formed of the second conductivity type; a collector section with a collector region layer formed of the first conductivity type which is provided on the surface of the conductivity modulating layer and is located opposite to the MIS section, while a source potential is applied to the isolation section, base region layer and source region layer, and a collector potential is applied to the collector region layer. Further, a drain wall section formed of the high concentration second conductivity type is provided between the MIS section and the collector section. In this semiconductor, channel stop means is formed around the collector section to maintain the surface potential on the conductivity modulating layer so that it is nearly equal to the potential on the drain wall section.

Further, the semiconductor equipped with a conductivity modulating-type MISFET with a high withstand voltage in bidirectional blocking, which includes an MIS section and collector section, has a collector region layer formed of the shallow or thin high concentration first conductivity type. In addition, electric field relaxation means to relax an electric field gradient at the edges of the collector region layer is formed around the edges of the collector region layer.

As the channel stop means, it is effective to form channel stop electrodes on an inter-layer insulation film disposed on the surface of the conductivity modulating layer, the channel stop electrodes being connected to the drain wall section. It is also effective to form a channel stopping diffusion layer formed of the second conductivity type on the surface of the conductivity modulating layer as the above channel stop means, the diffusion layer being connected to the drain wall section.

It is effective to form a deep or thick guard ring layer of the first conductivity type along the edges of the collector region layer as the electric field relaxation means. It is also effective, as the electric field relaxation means, to dispose a field electrode around the edge of the collector region layer on an inter-layer insulation film formed on the conductivity modulating layer, the potential on the field electrode being maintained at the same potential as in the collector electrode. Furthermore, it is also desirable to form both deep or thick guard ring layers formed of the first conductivity type and the field electrodes concurrently.

In a semiconductor equipped with a conductivity modulating-type MISFET with a high withstand voltage in bidirectional blocking, any punch-through between the collector region and the MIS section, and surface channels on the conductivity modulating layer are prevented by the drain wall section formed among them. The current amplification factor of a transistor including a collector region layer formed of the first conductivity type, a conductivity modulating layer formed of the second conductivity type and a base region layer formed of the first conductivity type can be controlled by the drain wall section. Therefore, a transistor including a source region layer formed of the second conductivity type, a collector region layer formed of the first conductivity type and a conductivity modulating layer formed of the second conductivity type is kept closed, thereby preventing occurrence of a latch-up phenomenon in the semiconductor.

Also, channel stop means is formed on the surface of the conductivity modulating layer between the collector section and the isolation section to transmit the potential on the drain wall section. When the semiconductor blocks in the forward direction, the collector potential is positively biased against the source potential. A depletion layer extends from the junction of the base region layer and the conductivity modulating layer, while the drain wall potential becomes nearly equal to the collector potential. When this semiconductor blocks in the reverse direction, the collector potential is negatively biased against the source potential. A depletion layer extends from the junction of the collector region layer and the conductivity modulating layer. For this reason, the drain wall potential is nearly equal to the source potential. Thus, in a blocked state, the drain wall potential is at the maximum positive potential. If a potential nearly equivalent to the drain wall potential is applied to the surface of the conductivity modulating layer between the collector section and the isolation section, the spread of the depletion layer from either the isolation section or the collector section is restricted to this applied potential. In other words, while a drain wall section is not formed between the collector section and the isolation section, the potential thereat is retained nearly equal to that at the drain wall formed between the collector section and the MIS section. As a result, the depletion layer between the collector section and the isolation section is suppressed to nearly the same state as that between the collector section and the MIS section where the drain wall section is formed. Therefore, a punch-through between the collector section and the isolation section can be prevented.

Furthermore, as explained above, the surface of the conductivity modulating layer between the collector section and the isolation section is retained at its maximum positive potential, which serves to prevent increase of the concentration of holes on the surface of the conductivity modulating layer. Therefore, no channels are formed as a result of inversion of this surface, and short circuits between the collector section and the isolation section are prevented. By disposing channel stop electrodes on the interlayer insulation film formed on the conductivity modulating layer and connecting these electrodes to the drain wall section, a potential on the surface of the conductivity modulating layer where the channel stop electrodes are disposed can be maintained nearly equal to the potential at the drain wall section. Also, in the case where the channel stopping diffusion layers formed of the second conductivity type and connected to the drain wall section are formed on the surface of the conductivity modulating layer, a potential on the surface of the conductivity modulating layer can be maintained nearly equal to the potential at the drain wall section by means of the channel stopping diffusion layers.

As described above, a withstand voltage can be maintained between the collector section and the isolation section even if no drain wall section formed of the second conductivity type is provided between these two sections. A conductivity modulating layer alone can be formed between these sections, by which the current amplification of the transistor formed of the collector section, conductivity modulating layer and drain wall section can be increased. This enables an increase in the current-carrying capacity of the semiconductor.

In addition, if the collector layer is of a thin layer formed of the high concentration first conductivity type, and the electric field relaxation means is formed only around the edges of the layer, the interface of the collector region layer formed of the first conductivity type with the conductivity modulating layer of the second conductivity type is formed in a high concentration state. For this reason, the collector region layer and the conductivity modulating layer, both being a step-like form, are interlocked with each other at this interface, resulting in an improvement of the hole injection efficiency. Therefore, the conductivity of the conductivity modulating layer is increased, and the current-carrying capacity can also be increased.

In a blocked state, the high electric field around the edges of the collector region layer is relaxed by the electric field relaxation means, at which the breakdown voltage does not exceed, thereby preventing generation of an avalanche effect.

As the means to relax the electric field, a guard ring layer can be used at the edges of the collector region layer, which uses a deep diffusion formed of the first conductivity type. In this case, the curvature at the edges of the collector region layer is increased, while the electric field distribution spreads out along the plane over this large curvature. As a result, concentration of electric field onto the edges can be prevented. Furthermore, if a field electrode is disposed around the collector region layer, a depletion region at the layer edges spreads out beneath the field electrode, along which the electric field distribution also spreads. Therefore, concentration of electric field onto the edges can also be prevented. It is also possible to use the above guard ring layer and field electrode simultaneously as the electric field relaxation means.

DETAILED DESCRIPTION OF PREFERRED EMBODIMENTS

Figure 9:
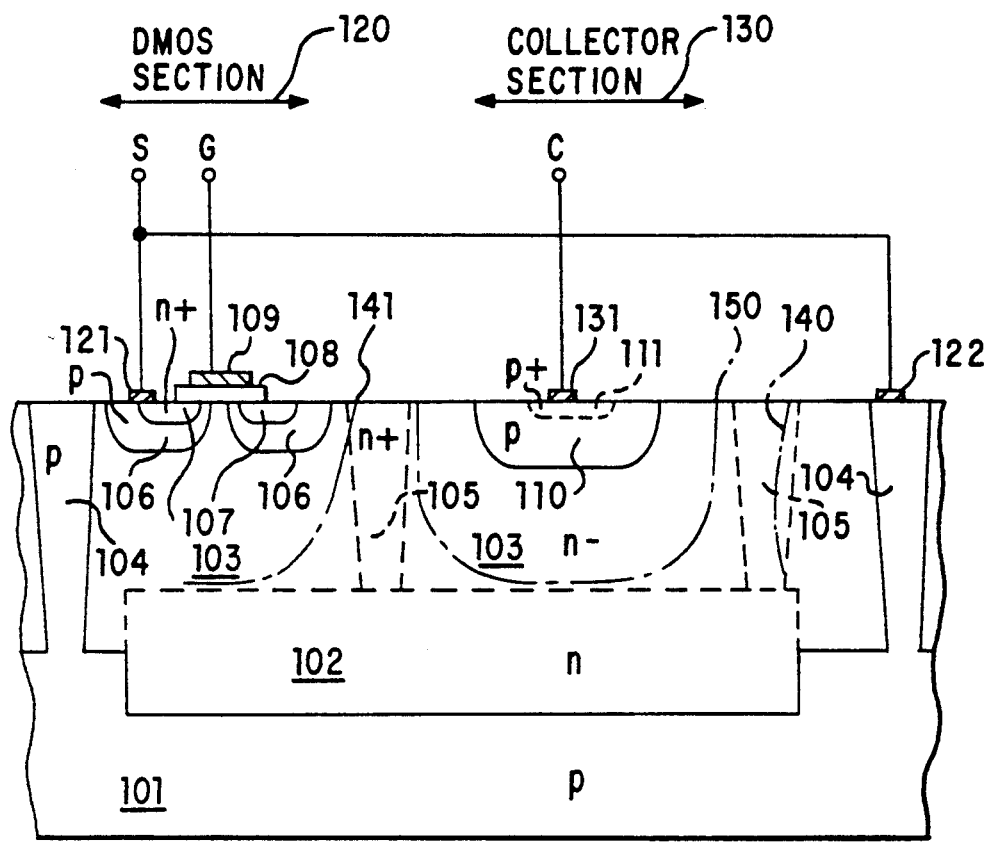
FIG. 9 is a cross section view of a conventional semiconductor equipped with an IGBT with a high withstand power in bidirectional blocking.
Figure 10:
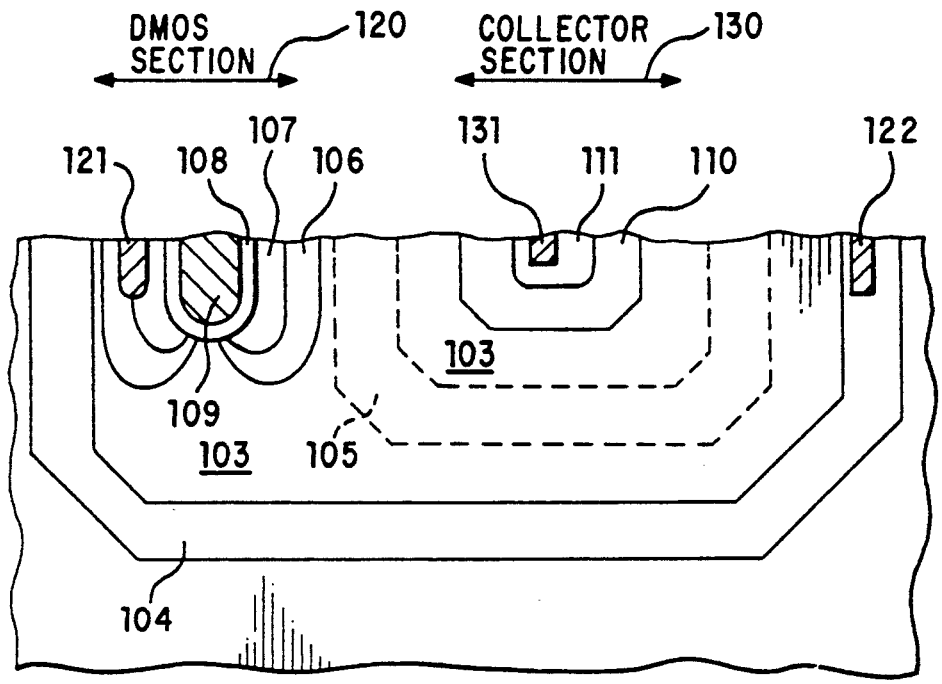
FIG. 10 is a plan view of the semiconductor shown in FIG. 9.

Regarding the structure of this embodiment, parts which correspond to the same parts in the conventional example (FIG. 9) are given the same numerals, and their explanation is omitted.

Figure 1:
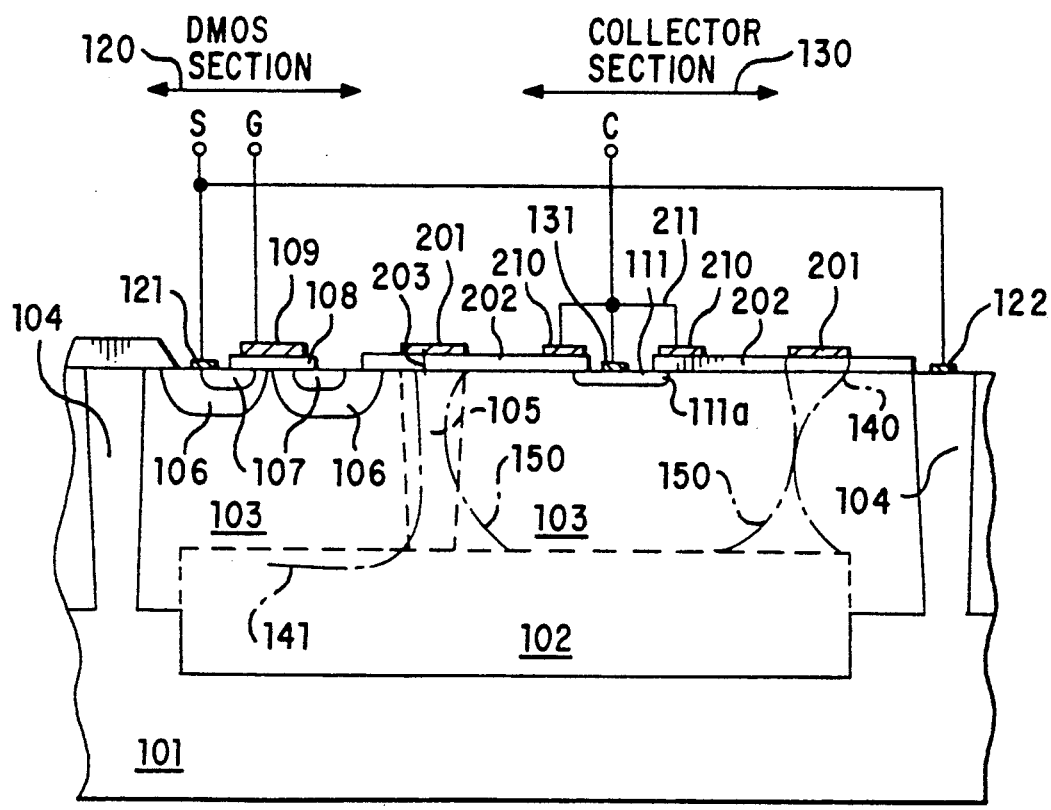
FIG. 1 is a cross section view of a semiconductor equipped with an IGBT with a high withstand power in bidirectional blocking according to a first embodiment of the present invention.

In a semiconductor equipped with an IGBT capable of blocking in two directions according to one embodiment of the present invention, as shown in FIG. 1, a potential at a drain wall section (105) is transmitted around a collector layer (111) by a channel stop electrode (201), and on top of the edge (111a) of the collector layer (111) a field electrode (210) is disposed to relax a high electric field.

Figure 2:
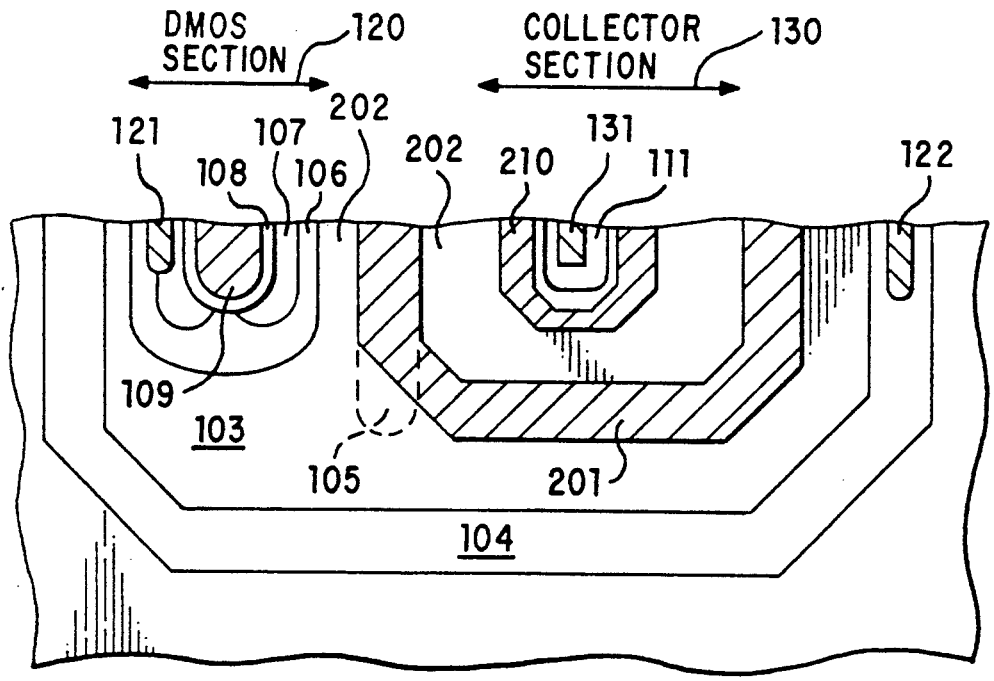
FIG. 2 is a plan view of the semiconductor shown in FIG. 1.
Figure 3:
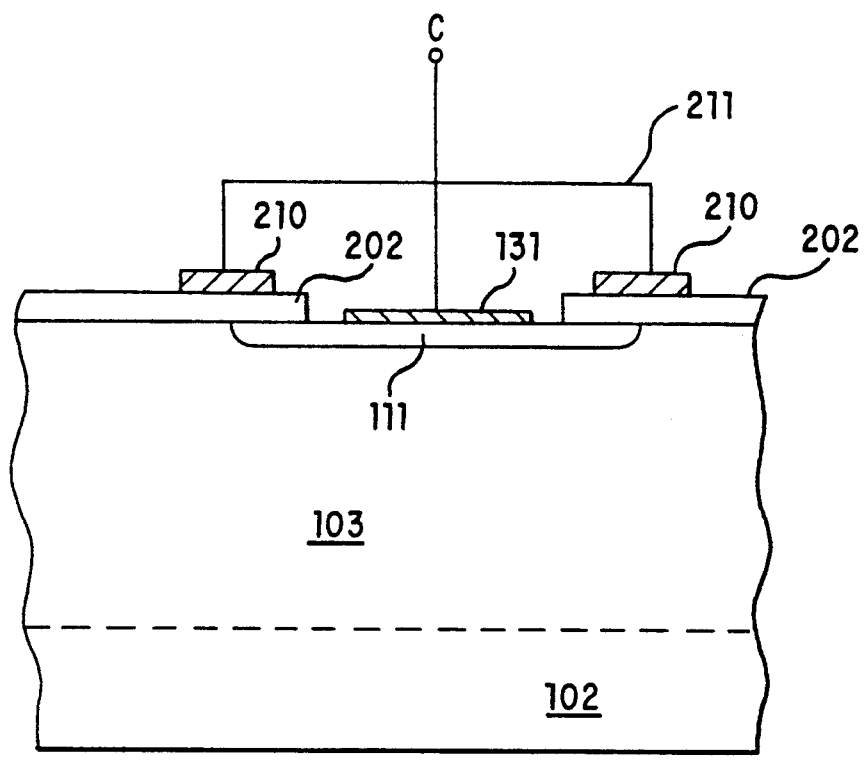
FIG. 3 is an enlarged cross section view of the semiconductor, showing a collector section of the semiconductor shown in FIG. 1.
Figure 4:
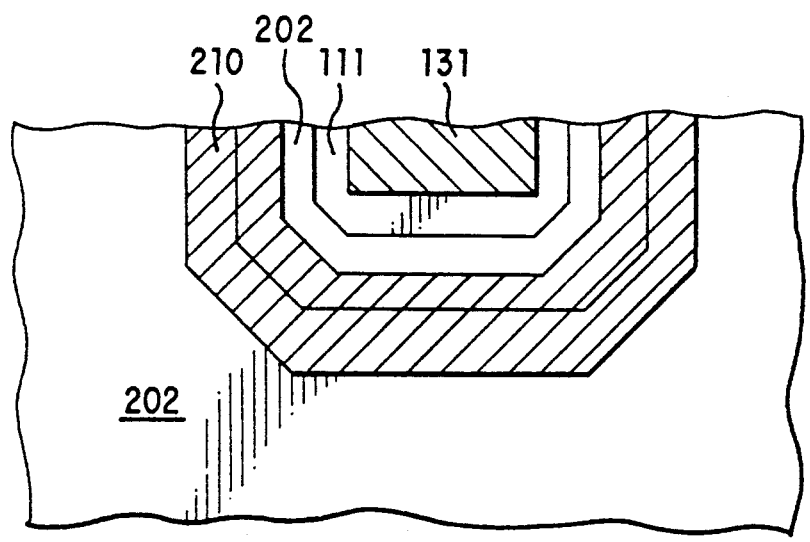
FIG. 4 is an enlarged plan view of the semiconductor, showing a top surface of a collector section of the semiconductor device shown in FIG. 3.

In this embodiment, the drain wall (105) is disposed only between a collector section (130) and a DMOS section (120) as shown in FIGS. 1 and 2. A channel stop electrode (201) is formed around the collector section (130), the electrode (201) being connected to the drain wall (105) by means of an Al wiring (203). The channel stop electrode (201) is formed on an interlayer insulation layer (202) laminated on the n⁻-type conductivity modulating layer 103, and is arranged between the collector section (130) and an isolation (104) when viewed from the surface of this semiconductor, as shown in the plan view of FIG. 2.

In addition, the collector layer to which a collector electrode (131) is connected, is formed of a single thin p+-type layer, the collector layer (111) being so formed as to directly contact the conductivity modulating layer (103). A field electrode (210) is disposed on top of the edge of the collector layer (111). The field electrode (210) is formed on the interlayer insulation layer (202), similar to the channel stop electrode (201). The field electrode (210) is connected to the collector electrode (131) by means of the Al wiring (211), to which a collector potential C is applied.

Figure 11:
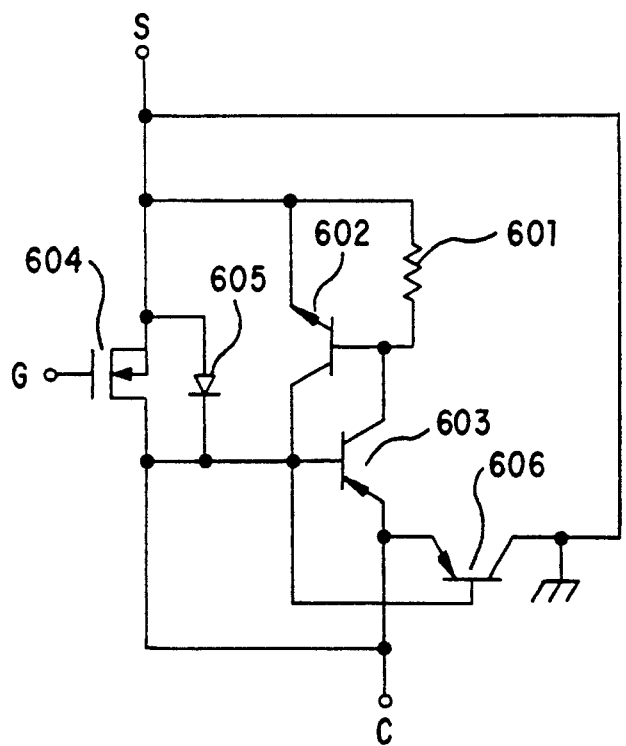
FIG. 11 is an equivalent circuit diagram of a semiconductor equipped with an IGBT with a high withstand power in bidirectional blocking as shown in FIGS. 1, 5 and 9.

In the IGBT according to this embodiment, the MOSFET composed in the DMOS section (120) turns on when a gate potential G is biased positively against a source potential S with the collector potential C in the forward direction where it is biased positively against the source potential S while the IGBT is being energized. In this state, no n-type drain wall is formed between the isolation (104) to which the source electrode (122) is connected, and the collector layer (111), but only an n−-type conductivity modulation layer is connected thereto. Therefore, the PNP transistor (transistor (606) in FIG. 11) formed of the isolation (104), the n−-type conductivity modulating layer, and the collector layer (111) has a high current amplification rate h$_{FE}$. Consequently, the current-carrying capacity of this IGBT is larger than that of the conventional IGBT. In addition, because the collector layer (111) is formed of a high concentration thin film layer, it is interlocked with the conductivity modulating layer (103) in a form of steps. As a result, the efficiency of the supplying holes from the collector layer (111) to the conductivity modulating layer (103) is improved. This improvement increases the conductivity in the conductivity modulating layer (103) in an energized condition, resulting in improvement of a current amplification rate h$_{FE}$. Also, because the drain wall (105) is formed between the collector section (130) and the DMOS section (120), the PNP transistor (transistor (603) in FIG. 11) formed of the collector layer (111), the conductivity modulating layer (103) and a base layer (106) has suppressed current amplification rate h$_{FE}$. Therefore, an NPN transistor (transistor (602) in FIG. 11) formed of a source layer (107), base layer (106) and the conductivity modulating layer (103) does not turn on, so that transfer of this IGBT to a latch-up state is prevented.

This IGBT turns to a blocked state in the forward direction when the gate potential G is the same as the source potential S with the collector potential C biased positively against the source potential S. In this state, the depletion layer (141) extending from the interface of the base layer (106) and the conductivity modulating layer (103) is restricted by the drain wall (105). The potential at the drain wall (105) is transmitted between the collector section (130) and the isolation layer (104) by a channel stop electrode (201). Because of this, the depletion layer (140) extending from the interface of the isolation (104) and the conductivity modulating layer (103) is also restricted along the transmitted potential by the channel stop electrode (201). Thus, the spread of the depletion layer from the base layer (106) and the isolation (104) can be restricted, so that a punch-through condition can be prevented. Furthermore, the surface of the conductivity modulating layer (103) between the collector section (130) and the isolation (104) is biased positively. Therefore, formation of channels to short the collector layer (111) with the isolation (104) as a result of the inversion of the surface of conductivity modulating layer (103) can also be prevented.

In case where the collector potential C is biased negatively against the source potential S, it is blocked in the reverse direction. In this state, the depletion layer (150) extends from an interface between the collector layer (111) and the conductivity modulating layer (103). This depletion layer (150) is also restricted in the same manner as described above by the drain wall (105) and the channel stop electrode (201) that transmits the potential at the drain wall (105), thereby preventing punch-through. Inversion of the conductivity modulating layer (103) is also prevented as in the case of a blocked condition in the forward direction. In this blocked condition in the reverse direction, a part with a small curvature, such as the edge (111a) in the collector layer (111), becomes a high electric field, to exceed the breakdown voltage. In this embodiment, an electric field concentration onto the edge (111a) is relaxed as a result of disposing a field electrode (210) and expanding the depletion layer at the edge (111a) of the collector layer. Therefore, the IGBT has a high voltage withstand capability even in the reverse direction.

As described above, the semiconductor equipped with an IGBT according to this embodiment has a withstand capability such as latch-up resistance and punch-through prevention, in both the forward and reverse directions, as in the conventional semiconductor equipped with an IGBT. The current-carrying capacity is largely improved as a result of partly eliminating the drain wall and raising the positive election supply efficiency.

Figure 5:
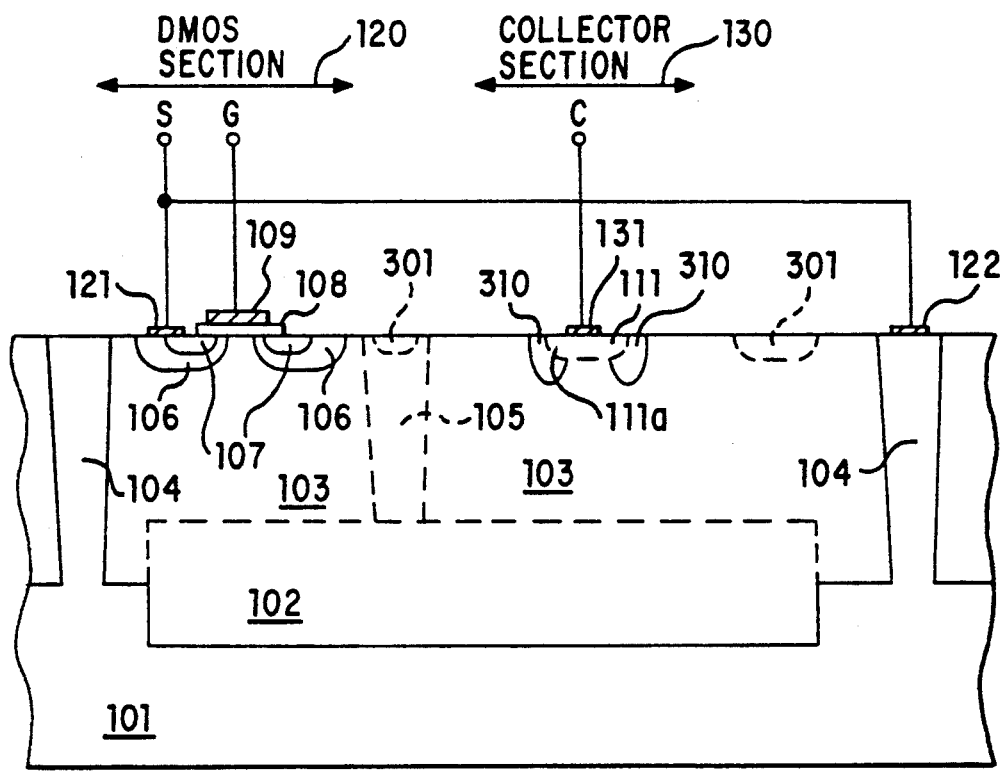
FIG. 5 is a cross section view of the semiconductor equipped with an IGBT according to a second embodiment of the present invention.
Figure 6:
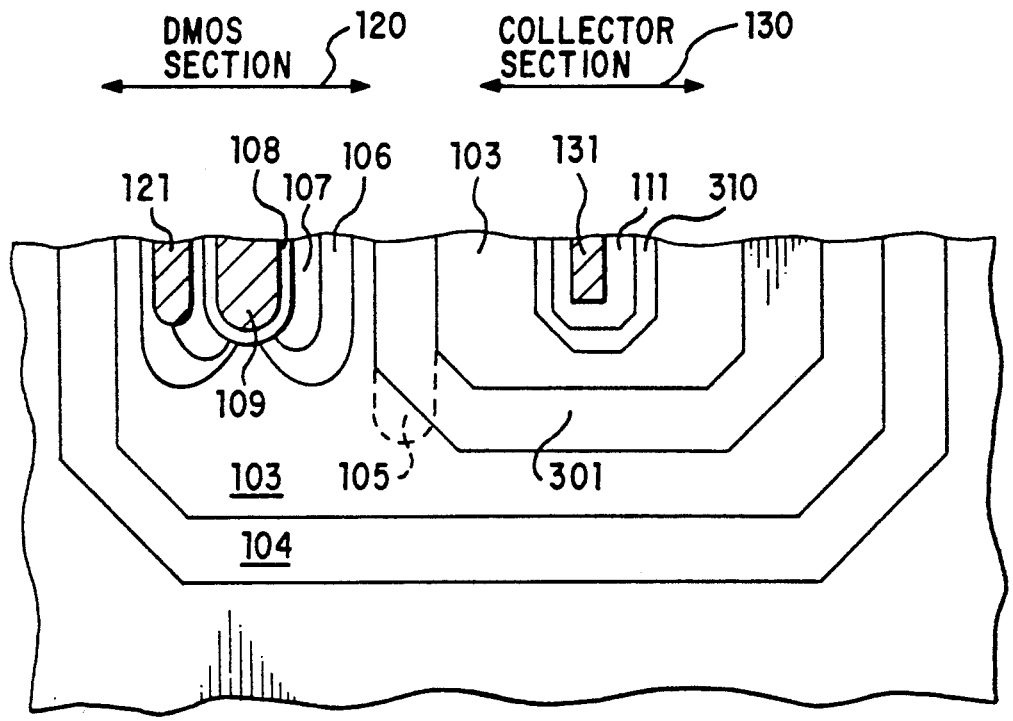
FIG. 6 is a plan view of the semiconductor shown in FIG. 5.
Figure 7:
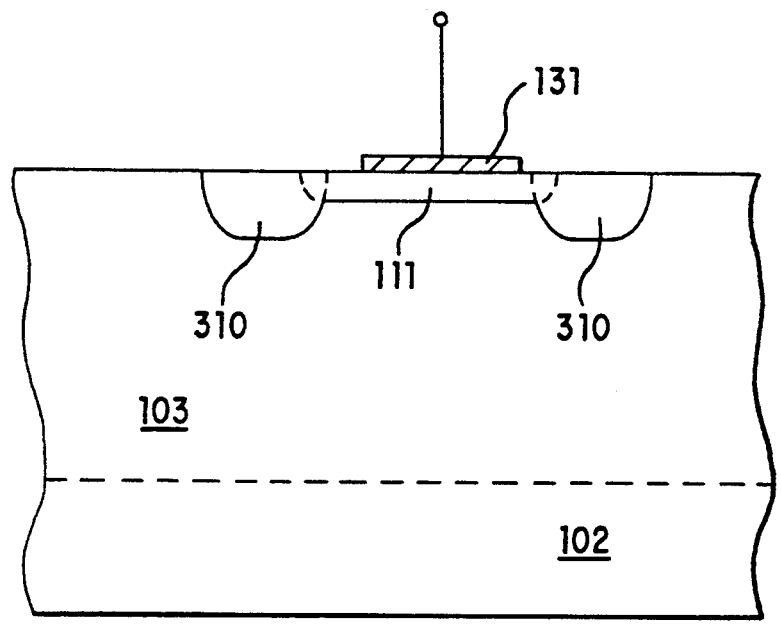
FIG. 7 is an enlarged cross section view of the semiconductor, showing a collector section of the semiconductor shown in FIG. 5.
Figure 8:
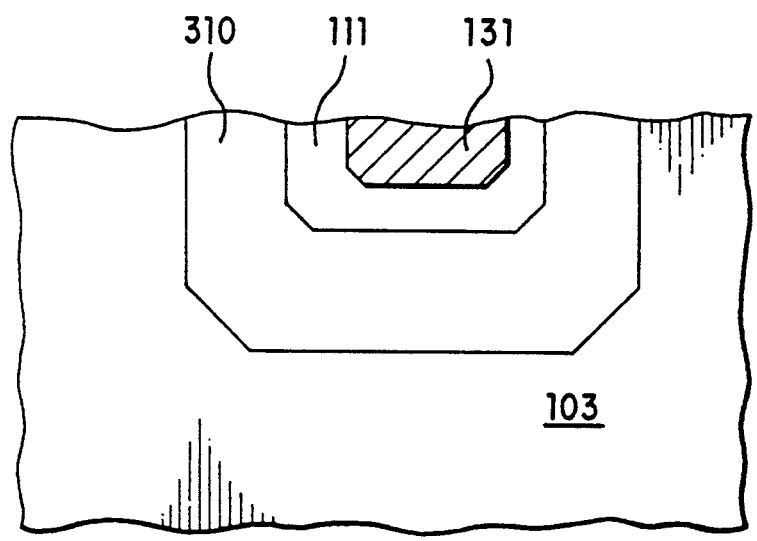
FIG. 8 is an enlarged plan view of the semiconductor, showing top surface of the collector section of the semiconductor shown in FIG. 7.

A semiconductor equipped with an IGBT according to another embodiment of the present invention is shown in FIGS. 5 6. In this device, an n+-type channel stop layer (301) is formed on the surface of the conductivity modulating layer (103), in lieu of the channel stop electrodes. This channel stop layer (301) is so formed as to surround a collector section (130) from the upper portion of a drain wall (105), and is arranged between the collector section (130) and an isolation section (104). Furthermore, in a collector layer (111), a p+-type deep guard ring (310) is formed at an edge (111a) of the collector layer (111), in lieu of the field electrode. Since the other constructions are identical with those in the first embodiment, the same parts have been given the same numerals, and their explanation is omitted.

Also in this embodiment, no drain wall (105) is disposed between the collector section (130) and the isolation (104), as in the first embodiment, and the collector layer (111) is of a p+-type thin layer and directly contacts with the conductivity modulating layer (103). Therefore, the current carrying capacity in an energized state is improved as in the first embodiment. Furthermore, in a blocked state, a potential at the drain wall (105) is transmitted to a portion between the collector section and the isolation layer (104) by the channel stop layer (301), and a punch-through and an inversion of the surface of the conductivity modulating layer (103) are, thereby, prevented.

Furthermore, a guard ring (310) is formed at the edge (111a) of the collector layer. This guard ring (310) is formed deeper than the collector layer (111), and its curvature is set larger than that of the edge (111a). Therefore, an electric field at the edge (111a) of the collector layer is distributed broadly along the surface of the guard ring (310). As a result, distribution of the electric field becomes wider, and the edge (111a) is prevented from attaining a high electric field.

As described above, the semiconductor equipped with an IGBT according to this embodiment has a withstand capability such as latch-up resistance and punch-through prevention, in both the forward and reverse directions, as in a conventional semiconductor equipped with an IGBT, while the current-carrying capacity is improved.

As described above, the present invention relates to a semiconductor equipped with a conductivity modulating MISFET with a high withstand voltage in bidirectional blocking, in which a potential at the drain wall section disposed between the collector section and an MIS section is transmitted to a portion between the collector section and an isolation section to retain a current-blocking withstand power between them, which has the following effects.

There is no need for the drain wall section to be disposed between the collector section and the isolation section, and only the conductivity modulating layer is allowed to be formed between these sections. This permits an increase in the current-carrying capacity in an energized condition over what conventional semiconductors permit. The blocking power in both the forward and reverse directions, such as the latch-up resistance and punch-through prevention, can be maintained at a level equal to that in the conventional semiconductors by the potential at the drain wall transmitted to a portion between the collector section and the isolation section.

Moreover, if means to relax the electric field is disposed around the edges of the collector layer formed of a high concentration thin film layer, a high electric field at the edges of the collector layer in a state of blocking in the reverse direction, can be prevented by the electric field relaxation means. In an energized state, the efficiency of supplying positive electrons from the collector layer formed of a thin film layer to the conductivity modulating layer can be improved. As a result, the current-carrying capacity of this semiconductor can be further increased.

Thus, the semiconductor equipped with a conductivity modulating MISFET, which has a high withstand voltage in bidirectional blocking according to the present invention, can retain withstand power as that in the conventional semiconductors, and at the same time, the current-carrying capacity can be far increased when compared with that in the conventional semiconductors.

What is claimed is:

1. A semiconductor having a conductivity modulating-type MISFET with a high withstand voltage in bidirectional blocking, a source potential and a collector potential being applied to said semiconductor, said semiconductor comprising, an isolation section formed of a first conductivity type to which the source potential is applied, a conductivity modulating layer formed of a second conductivity type, said layer being separated by said isolation section, an MIS section disposed on a surface of the conductivity modulating layer and including a base region layer formed of the first conductivity type and a source region layer formed of the second conductivity type, the source potential being applied to the MIS section, a collector section disposed on the surface of the conductivity modulating layer located near said MIS section and including a collector region layer formed of the first conductivity type, said collector potential being applied to the collector section, a high concentration drain wall section formed between the MIS section and the collector section, said drain wall section being formed of the second conductivity type, and channel stop means formed around the collector section, said channel stop means maintaining a surface potential on said conductivity modulating layer to be substantially equal to the potential on the drain wall section, said channel stop means being a channel stop electrode disposed on an inter-layer insulation film on the surface of the conductivity modulating layer, said channel stop electrode being connected to the drain wall section.

2. A semiconductor having a conductivity modulating-type MISFET with a high withstand voltage in bidirectional blocking, a source potential and a collector potential being applied to said semiconductor, said semiconductor comprising, an isolation section formed of a first conductivity type to which the source potential is applied, a conductivity modulating layer formed of a second conductivity type, said layer being separated by said isolation section, an MIS section disposed on a surface of the conductivity modulating layer and including a base region layer formed of the first conductivity type and a source region layer formed of the second conductivity type, the source potential being applied to the MIS section, a collector section disposed on the surface of the conductivity modulating layer located near said MIS section and including a collector region layer formed o the first conductivity type, said collector potential being applied to the collector region layer, a high concentration drain wall section formed between the MIS section and the collector section, without surrounding the collector section, said drain wall section being formed of the second conductivity type, channel stop means formed around the collector section, said channel stop means maintaining a surface potential on said conductivity modulating layer to be substantially equal to the potential on the drain wall section, said channel stop means being a channel stop diffusion layer formed of the second conductivity type and disposed only on the surface of the conductivity modulating layer without deeply extending into the conductivity modulating layer, said channel stop diffusion layer being connected to the drain wall section, and electric field relaxation means disposed around edges of the collector region layer, said relaxation means being formed of a high doped shallow layer to relax the electric field gradient around the edges of the collector region layer.

3. A semiconductor having a conductivity modulating-type MISFET as claimed in claim 1, in which said collector region layer is formed of a highly doped shallow layer, said semiconductor further comprising electric field relaxation means disposed around edges of the collector region layer, said relaxation means relaxing the electric field gradient around the edges of the collector region layer.

4. A semiconductor having a conductivity modulating-type MISFET as claimed in claim 2, in which the electric field relaxation means is a deep guard ring layer formed of the first conductivity type and provided at edges of the collector region layer.

5. A semiconductor having a conductivity modulating-type MISFET as claimed in claim 2, in which the electric field relaxation means is a field electrode disposed around the collector region layer on an inter-layer insulating film formed on the conductivity modulating layer, said field electrode being maintained at the same potential as in the collector electrode.

6. A semiconductor having a conductivity modulating-type MISFET as claimed in claim 2, in which the electric field relaxation means includes a deep guard ring layer formed of the first conductivity type and disposed at edges of the collector region layer, and a field electrode disposed around the collector region layer on an inter-layer insulation film formed on the conductivity modulating layer, said field electrode being maintained at the same potential as in the collector electrode.

7. A semiconductor having a conductivity modulating-type MISFET as claimed in claim 3, in which the electric field relaxation means is a deep guard ring layer formed of the first conductivity type and provided at edges of the collector region layer.

8. A semiconductor having a conductivity modulating-type MISFET as claimed in claim 3, in which the electric field relaxation means is a field electrode disposed around the collector region layer on an inter-layer insulating film formed on the conductivity modulating layer, said field electrode being maintained at the same potential as in the collector electrode.

9. A semiconductor having a conductivity modulating-type MISFET as claimed in claim 3, in which the electric field relaxation means includes a deep guard ring layer formed of the first conductivity type and disposed at edges of the collector region layer, and a field electrode disposed around the collector region layer on an inter-layer insulation film formed on the conductivity modulating layer, said field electrode being maintained at the same potential as collector electrode.

10. A semiconductor having a conductivity modulating-type MISFET as claimed in claim 2, wherein said channel stop diffusion layer is located between the collector section and the isolation section and has a depth less than the drain wall section.

* * * * *